United States Patent [19]

Barrett

[11] Patent Number: 4,647,848
[45] Date of Patent: Mar. 3, 1987

[54] BROADBAND RF POWER DETECTOR USING FET

[75] Inventor: Ronald A. Barrett, Tigard, Oreg.

[73] Assignee: Tektronix, Inc., Beaverton, Oreg.

[21] Appl. No.: 586,173

[22] Filed: Mar. 5, 1984

[51] Int. Cl.$^4$ .......................... G01R 23/04; H03B 1/04
[52] U.S. Cl. ..................................... 324/95; 307/550
[58] Field of Search .................. 329/101, 102, 205 R, 329/206, 119; 324/95, 119, 132; 307/304, 501, 550; 328/144

[56] References Cited

U.S. PATENT DOCUMENTS 3,348,062  10/1967  Carlson et al. ...................... 307/304
3,694,744   9/1972  Kalotay ............................... 307/304

Primary Examiner—Ernest F. Karlsen
Assistant Examiner—Vinh P. Nguyen
Attorney, Agent, or Firm—Allston L. Jones; John Smith-Hill; George T. Noe

[57] ABSTRACT

A junction field effect transistor circuit is used to detect the power level contained in radio frequency signals over a wide range of frequencies and signal levels. The radio frequency signal is coupled to the drain of a junction field effect transistor, the gate of which is biased at a d.c. potential equal to the pinch off voltage. The radio frequency signal is also coupled to the gate. The resulting current from the source contains a d.c. term proportional to the square of the magnitude of the radio frequency signal, as well as time varying signal components. A low pass filter is employed to remove the time varying signal components from the resulting source current to produce a D.C. output current which is proportional to the power level of the input signal.

9 Claims, 3 Drawing Figures

BROADBAND RF POWER DETECTOR USING FET

BACKGROUND

This invention relates generally to the measurement of power, and in particular to the measurement of power present in a radio frequency signal over a broad range of frequencies and signal levels.

It is frequently desirable in working with radio frequency apparatus to have the capability to monitor the amount of power present in a radio frequency signal. The amount of power present in a radio frequency signal can be used to determine the efficiency of associated apparatus. In particular, by monitoring the amount of power present in a radio frequency signal in response to adjustments to associated apparatus, the effects of such adjustments can be immediately determined. Such an approach to the adjustment process could be applied not only to a radio frequency transmitter, but also to apparatus associated therewith, e.g., matching devices, transmission lines and antennas.

The monitoring of power present in a radio frequency signal can also be useful in the development of antennas. In particular, antennas are frequently designed to direct the radiation of a radio frequency signal in a selected direction. Consequently, apparatus for determining the power present in a radio frequency signal would be useful in empirically determining the pattern of radiation from an antenna.

It is desirable to have a method for measuring the power level of a radio frequency signal through a wide dynamic range of power levels. Such a power measuring device would minimize the use of external attenuators which quickly become cumbersome to use during measurements.

In addition to the foregoing, radio transmitters frequently are capable of producing radio frequency signals over a broad range of frequencies. Consequently, it is desirable that power monitoring apparatus have a similar capability to measure the amount of power in a radio frequency signal over a corresponding broad range of frequencies.

Various techniques are employed in measuring the amount of power present in a radio frequency signal. One such technique employs the use of a thermocouple device, wherein a radio frequency signal is applied to a load physically coupled to the thermocouple, and the resulting heat generated is measured. As the amount of heat produced is proportional to the power delivered to the load, the amount of power associated with the radio frequency signal may be correspondingly determined. While such an approach does give an indication of the amount of power present in a radio frequency signal, such an approach does have a number of disadvantages. In particular, such measurements are accurate over only a limited range of signal levels due to limitations of the thermocouple.

An alternate approach to the measurement of radio frequency power has employed the use of diodes. In particular, as the relationship between voltage and current in a diode is fundamentally a square law relationship at low signal levels, diodes may be used in determining the amount of power present in a radio frequency signal. However, as the square law relation between voltage and current in a diode is only valid over a portion of the overall voltage current relationship of a diode, such an approach does have limitations. Use of such an approach is necessarily limited to signal levels which are within the limited square law region of the diode voltage current relationship. Consequently, such apparatus is limited in the range of signal levels with which it may be used. Other apparatus frequently used to measure the amount of power present in a radio frequency signal include multipliers and directional couplers. However, such apparatus is not only expensive, but often limited in the dynamic range of signals which it is capable of measuring.

SUMMARY

In accordance with the present invention, the square law relationship between gate voltage and drain to source current in a junction field effect transistor is employed to provide for the measurement of power associated with a radio frequency signal over a broad range of signal levels and a wide range of frequencies. In particular, a radio frequency signal is coupled to the drain of a junction field effect transistor. The gate of the junction field effect transistor is biased at a d.c. potential equal to the pinch off voltage of the junction field effect transistor. The radio frequency signal is also coupled to the gate. The resulting current signal from the source terminal of the junction field effect transistor is coupled to a low pass filter to remove signal frequency components therefrom. The magnitude of the resulting D.C. current from the low pass filter is proportional to the power of the radio frequency signal.

It is therefore a corresponding object of the present invention to provide for the measurement of power associated with a radio frequency signal.

It is a further object of the present invention to provide for the measurement of power associated with a radio frequency signal over a wide range of signal levels and a broad range of frequencies.

It is a yet further object of the present invention to provide for the measurement of power associated with a radio frequency signal over a wide range of signal levels and a broad range of frequencies in a simple and relatively inexpensive manner.

The above and other objects, features and advantages of the present invention will be better understood from the following detailed description when read in conjunction with the accompanying Figures.

DETAILED DESCRIPTION

Drain current $i_d$ of a junction field effect transistor may be expressed in terms of the drain to source current $I_{DSS}$ with the gate shorted to the source, the gate to source potential $v_{gs}$ and the gate to source pinch off voltage $V_p$, according to $$i_d = I_{DSS}(1 - v_{gs}/V_p)^2. \tag{1}$$

For small drain to source voltages, e.g., $$|v_{ds}| \leq |V_p/10|, \tag{2}$$

the drain to source conductance $g_{ds}$ may be expressed according to $$g_{ds} = [2I_{DSS}/(-V_P)][1 - v_{gs}/V_p]. \quad (3)$$

Figure 1:
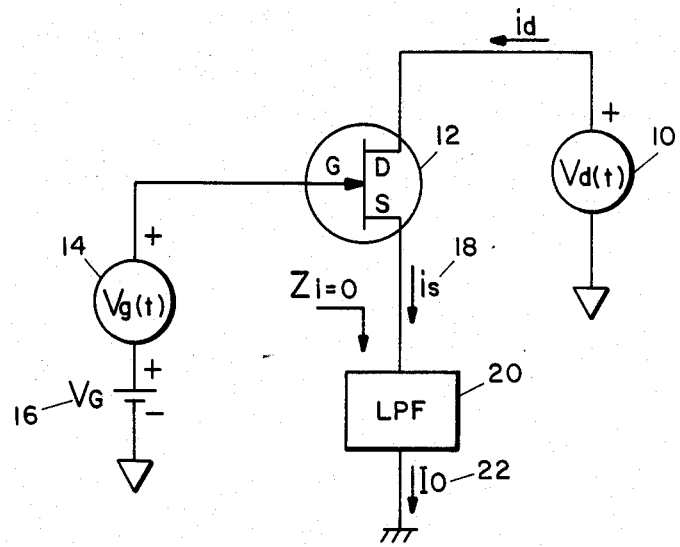
FIG. 1 illustrates considerations associated with a mathematical analysis of a junction field effect transistor used in accordance with the present invention.

FIG. 1 illustrates considerations associated with the present invention. Referring to FIG. 1, a time varying potential source $v_d(t)$ 10 is coupled to the drain of an N-channel junction field effect transistor 12. A source 16 of d.c. potential $V_G$ is connected in series with a second time varying source 14 of potential $v_g(t)$ to the gate of field effect transistor 12. A current $i_s$ 18 from the source terminal of field effect transistor 12 is coupled to a low pass filter 20, which produces an output current $I_o$ 22 in response thereto.

For a N channel junction field effect transistor, $V_P < 0$ and $V_{GS} \geq V_P$ in the active region.

If the potential $V_s$ of the source terminal of field effect transistor 12 is at zero volts, then for $V_G \geq V_p$, the potential difference between the gate and source, $v_{gs}$, may be stated as $$v_{gs}(t) = v_g(t) + V_G, \quad (4)$$

where $v_g(t)$ represents the value of the time varying potential source 14 and $V_G$ represents the value of the constant potential source 16.

The drain current $i_d$ of field effect transistor 12 can be expressed as follows:

$$i_d(t) = g_{ds} v_d(t), \quad (5)$$

and may consequently be expressed as $$i_d(t) = [2I_{DSS} v_d(t)/(-V_P)][1 - (v_g(t) + V_G)/V_P], \quad (6)$$

or $$i_d(t) = [2I_{DSS} v_d(t)/(V_P^2)][v_g(t) + (V_G - V_P)]. \quad (7)$$

Now, if $v_d(t) = v_g(t)$, then $$i_d(t) = u v_d^2(t) + u v_d(t)(V_G - V_P), \quad (8)$$

where $u = 2I_{DSS}/V_P^2$.

Note from equation (8) above, that if $V_G = V_P$, $$i_d(t) = u v_d^2(t) \quad (9)$$

or $$i_d(t) = (2I_{DSS}/V_P^2) v_d^2(t) \quad (10)$$

Thus, it can be seen that the circuit of FIG. 1 squares any signal within its dynamic range if the stated condition is met.

Assuming $v_d(t)$ represents a radio frequency signal, i.e., $v_d(t) = A \cos wt$, then from equation (9)

$$i_d(t) = u A^2 \cos^2 wt \quad (11)$$

$$= uA^2[(\tfrac{1}{2}) + (\tfrac{1}{2})(\cos 2 wt)] \quad (11A)$$

Assuming negligible gate current, $$i_s = i_d. \quad (12)$$

Assuming low pass filter 20 functions to remove the time varying components from $i_d(t)$, the output current $I_o$ 22 from equation (11A) is $$I_o = (\tfrac{1}{2}) u A^2, \quad (13)$$

or $$I_o = A^2 I_{DSS}/V_P^2. \quad (14)$$

Consequently it is observed that the output current $I_o$ 22 is proportional to the square of the amplitude of the signal when $v_d(t) = v_g(t)$.

Figure 2:
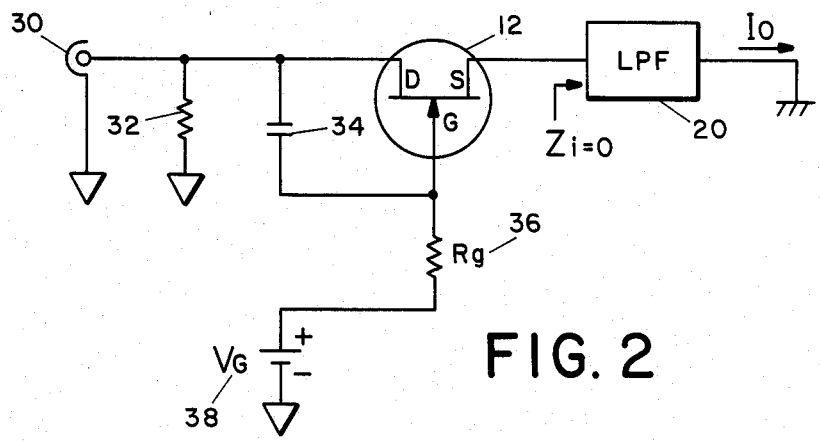
FIG. 2 illustrates a functional application of a junction field effect transistor in apparatus in accordance with the present invention.

FIG. 2 illustrates functional apparatus in accordance with the present invention. An input signal applied to input 30 is directly coupled to the drain of N-channel field effect transistor 12. Resistor 32 terminates the transmission line connected to terminal 30 in its characteristic impedance $Z_o$. Capacitor 34 couples the drain to the gate of field effect transistor 12. Resistor 36 is connected between the gate of field effect transistor 12 and a source 38 of constant potential $V_G$. The source of field effect transistor 12 is coupled to low pass filter 20.

Source 38 provides a bias voltage at the gate of junction field effect transistor 12 equal to the pinch off potential $V_P$, as previously discussed with reference to equation (9).

Capacitor 34 couples the input signal to the gate of field effect transistor 12 as discussed with reference to equation (8), i.e., $v_d(t) = v_g(t)$, and is selected such that the impedance presented by capacitor 34 at the frequency of operation is negligible when compared to the impedance, $Z_o$, of the input transmission line.

Resistor 32 is selected to provide an input impedance equal to $Z_o$ at input 30 as determined by the impedance of the input network formed by the parallel combination of resistor 32, resistor 36 and the transresistance $1/g_m$ of junction field effect transistor 12. Low pass filter 20 functions to remote time varying components from the source current of field effect transistor 12, as previously discussed with reference to equation (13). In the preferred embodiment, low pass filter 20 was selected to have a cutoff frequency of approximately ten to twenty hertz, with a passive pi filter section followed by an active filter.

Figure 3:
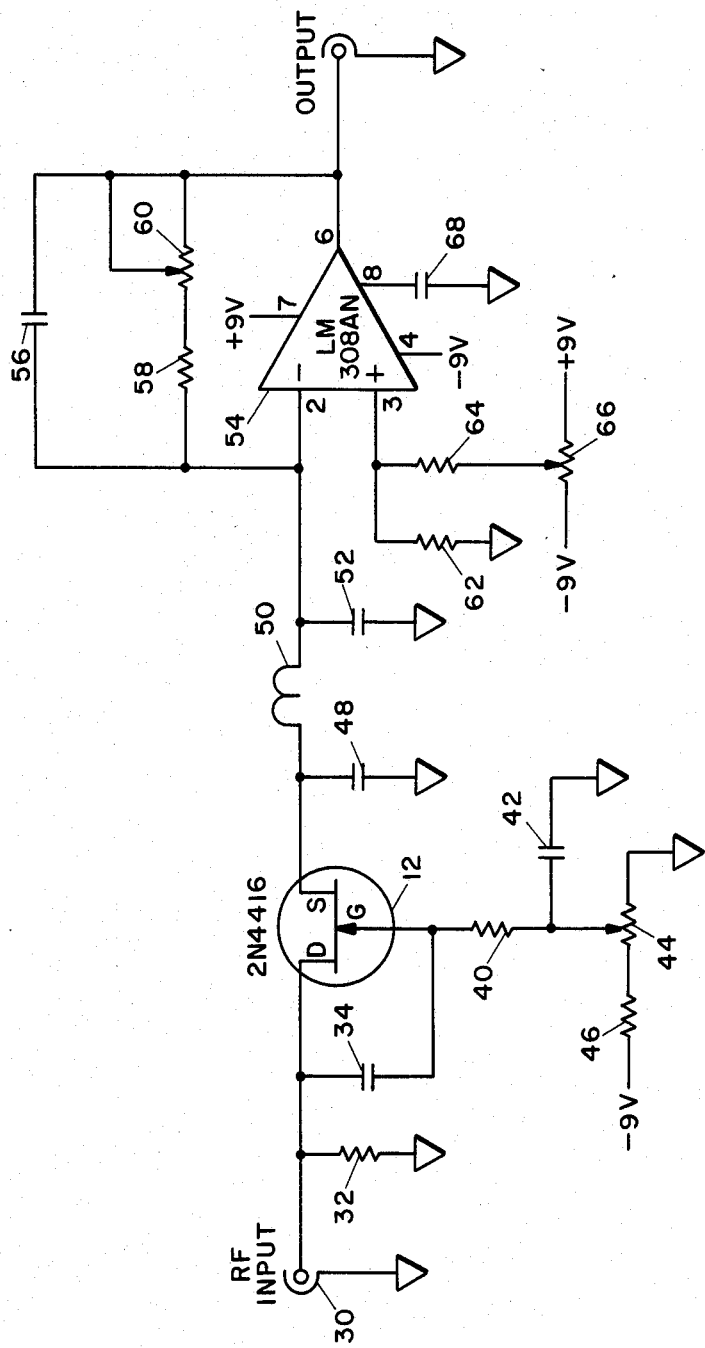
FIG. 3 illustrates a preferred embodiment of apparatus in accordance with the present invention.

FIG. 3 illustrates the preferred embodiment of the apparatus in accordance with the present invention. Referring to FIG. 3, an input signal applied to input 30 is coupled to the drain of field effect transistor 12. Resistor 32 couples the drain of field effect transistor 12 to ground potential, and is selected to provide a termination for the input transmission line connected to terminal 30. Capacitor 34 couples the drain to the gate of field effect transistor 12, and is selected to provide a low impedance path for the input signal to the gate of field effect transistor 12. Resistor 40 is connected between the gate of field effect transistor 12 and a series voltage divider composed of resistor 46 and potentiometer 44 configured between a source of negative potential and ground potential. Potentiometer 44 serves to provide a means to adjust the d.c. potential applied to the gate of field effect transistor 12. Capacitor 42 couples the junction of resistor 40 and the series voltage divider to A.C. ground potential. Inductor 50 couples the source terminal of field effect transistor 12 to an inverting input terminal of operational amplifier 54. Capacitors 48 and 52 couple each end of inductor 50 to ground potential. Inductor 50 and capacitors 48 and 52 form a passive pi section low-pass filter. Operational amplifier 54 has capacitor 56 as well as a series combination of resistor 58 and potentiometer 60 coupled between the output and inverting input terminals. Potentiometer 60 provides means for adjusting the gain of operational amplifier 54. The non-inverting input terminal of operational amplifier 54 is connected to ground through resistor 62. The non-inverting input terminal of operational amplifier 54 is also coupled by resistor 64 to an offset potential provided by potentiometer 66 configured between potential sources of opposite polarity. The output of operational amplifier 54 provides a voltage which is proportional to the D.C. current through inductor 50 which in turn is proportional to the power level of the signal coupled to input terminal 30.

Preferred values of the components in the schematic of FIG. 3 are given in Table I.

TABLE I

| COMPONENT | VALUE OR TYPE |
| --- | --- |
| Resistor 32 | 56 ohm |
| Resistor 40 | 1K ohm |
| Resistor 46 | 6.2K ohm |
| Resistor 58 | 100K ohm |
| Resistor 62 | 1K ohm |
| Resistor 64 | 10 M ohm |
| Potentiometer 44 | 5K ohm |
| Potentiometer 60 | 100K ohm |
| Potentiometer 66 | 1 M ohm |
| Capacitor 34 | 1000 picofarad |
| Capacitor 42 | 470 picofarad |
| Capacitor 48 | 1000 picofarad |
| Capacitor 52 | 1000 picofarad |
| Capacitor 56 | 0.1 microfarad |
| Capacitor 68 | 220 picofarads |
| Inductor 50 | 0.5 microhenry |
| Junction Field Effect Transistor 12 | 2N4416 |
| Operational Amplifier 54 | LM308AN |

In the test embodiment discussed above and shown in FIG. 3 it was observed that the circuit provided substantially the mathematically calculated result over a frequency range of at least 10 to 500 MHz. The useful dynamic range of the test circuit was −34 to −4 dbm when the bias voltage was adjusted to maximize the output signal level with a −20 dbm input signal level, and the gain adjusted for a 100 mv output signal level for a −20 dmb input signal level.

From the foregoing it is consequently observed that apparatus in accordance with the present invention operates to provide an indication of the power present in a radio frequency signal over a wide range of signal levels and a broad range of frequencies. Although there has been described herein above a specific embodiment of the present invention, it will be appreciated that the invention is not limited thereto. Accordingly, any and all modifications, variations or equivalent arrangements which may occur to those skilled in the art should be considered to be within the scope of the invention, as defined by the following claims.

I claim:

1. Apparatus for detecting the power level present in a radio frequency signal, comprising:
    a field effect transistor having a pinch off potential associated therewith, a first gate terminal, and second and third terminals, with the radio frequency signal applied to said second terminal;
    means for biasing the first gate terminal at a desired potential;
    means for capacitively coupling the radio frequency signal to the first gate terminal; and,
    low pass filter means coupled to the third terminal for removing time varying components from an output signal produced in response to said radio frequency signal applied to said second terminal.

2. Apparatus as in claim 1, wherein the desired potential is the pinch off potential associated with the field effect transistor.

3. A method for detecting the power level present in a radio frequency signal, comprising the steps of:
    applying the radio frequency signal to drain and gate terminals of the field effect transistor;
    biasing the gate terminal of the field effect transistor substantially at a pinch off potential associated with the field effect transistor; and
    removing by means of a low pass filter coupled to a source terminal of the field effect transistor a time varying component from a signal produced by the field effect transistor in response to said radio frequency.

4. A method for detecting the power level present in a radio frequency signal with a field effect transistor having a pinch off potential associated therewith, first and second channel electrodes and a gate electrode, comprising the steps of:
    applying the radio frequency signal to the first channel electrode;
    biasing the gate electrode at a desired potential;
    A.C. coupling the radio frequency signal to the gate electrode; and,
    removing a time varying component from a signal from the second channel electrode produced in response to said radio frequency signal.

5. A method for detecting the power level present in a radio frequency signal as in claim 4, wherein the desired potential is the pinch off potential of the field effect transistor.

6. Apparatus for detecting the power level present in a radio frequency signal, comprising;
    a field effect transistor having a pinch off potential associated therewith, a first gate terminal, and second and third terminals;
    means for coupling the radio frequency signal to the second terminal;
    impedance matching means coupled to the second terminal to providing for a desired input impedance;
    coupling means for capacitively coupling the second terminal of the first gate terminal;
    means for biasing the first gate terminal at a desired potential; and
    filter means coupled to the third terminal for removing a time varying component of an output signal therefrom produced in response to said radio signal.

7. Apparatus as in claim 6, wherein said filter means further comprises:
    pi-section filter means coupled to the third terminal; and
    active filter means coupled to the output terminal of the pi-section filter;
    said pi-section filter and active filter means cooperatively removing said time varying signal component from said output signal.

8. Apparatus as in claim 6, wherein said filter means comprises a low pass filter having an upper band limit not exceeding 20 hertz.

9. Apparatus as in claim 6, wherein the desired potential is the pinch off potential associated with the field effect transistor.

* * * * *